(12) United States Patent
Kartadinata et al.

(10) Patent No.: US 11,632,867 B2
(45) Date of Patent: Apr. 18, 2023

(54) CABLE MANAGEMENT ARM FOR A COMPUTING SYSTEM

(71) Applicant: Hewlett Packard Enterprise Development LP, Houston, TX (US)

(72) Inventors: Warren Kartadinata, San Jose, CA (US); Vance Murakami, Los Gatos, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/447,207

(22) Filed: Sep. 9, 2021

(65) Prior Publication Data
US 2023/0071067 A1  Mar. 9, 2023

(51) Int. Cl.
*H05K 7/20* (2006.01)
*H05K 5/02* (2006.01)
*H05K 7/14* (2006.01)

(52) U.S. Cl.
CPC ......... *H05K 5/0247* (2013.01); *H05K 5/0221* (2013.01); *H05K 7/1491* (2013.01)

(58) Field of Classification Search
CPC ... H05K 5/0247; H05K 5/0221; H05K 7/1491
See application file for complete search history.

(56) References Cited

U.S. PATENT DOCUMENTS

| 6,708,830 | B2 | 3/2004 | Mendoza |
| 7,026,553 | B2 | 4/2006 | Levesque et al. |
| 9,277,663 | B2 | 3/2016 | George et al. |
| 9,336,833 | B2* | 5/2016 | Walsh ................. H05K 7/1489 |
| 2004/0120105 | A1* | 6/2004 | Subbarao ................. G06F 1/16 361/679.25 |
| 2021/0029845 | A1* | 1/2021 | Gundogan ........... H05K 7/1491 |

OTHER PUBLICATIONS

Belden®; "Belden® Rack and Cabinet Systems Catalog"; Feb. 16, 2019; 84 pages.

* cited by examiner

*Primary Examiner* — Anthony Q Edwards
*Assistant Examiner* — Hung Q Dang
(74) *Attorney, Agent, or Firm* — Hewlett Packard Enterprise

(57) ABSTRACT

Example implementations relate to a cable management arm for a computing system. The cable management arm includes a pair of latches, a pair of first bars, and a second bar. The pair of latches is detachably connectable to a chassis of the computing system. Each first bar has a first end pivotably connected to a respective latch of the pair of latches, and a second end connected to the second bar for defining an open space therebetween. The open space provides a non-interfering entrance for accessing the one or more electronic components from rear side of the chassis. The second bar supports the cables connected to the one or more electronic components. The pair of first bars is pivotable relative to the pair of latches such that the second bar is movable to a plurality of preset positions for providing the clearance from the cables during service event, for instance.

18 Claims, 9 Drawing Sheets

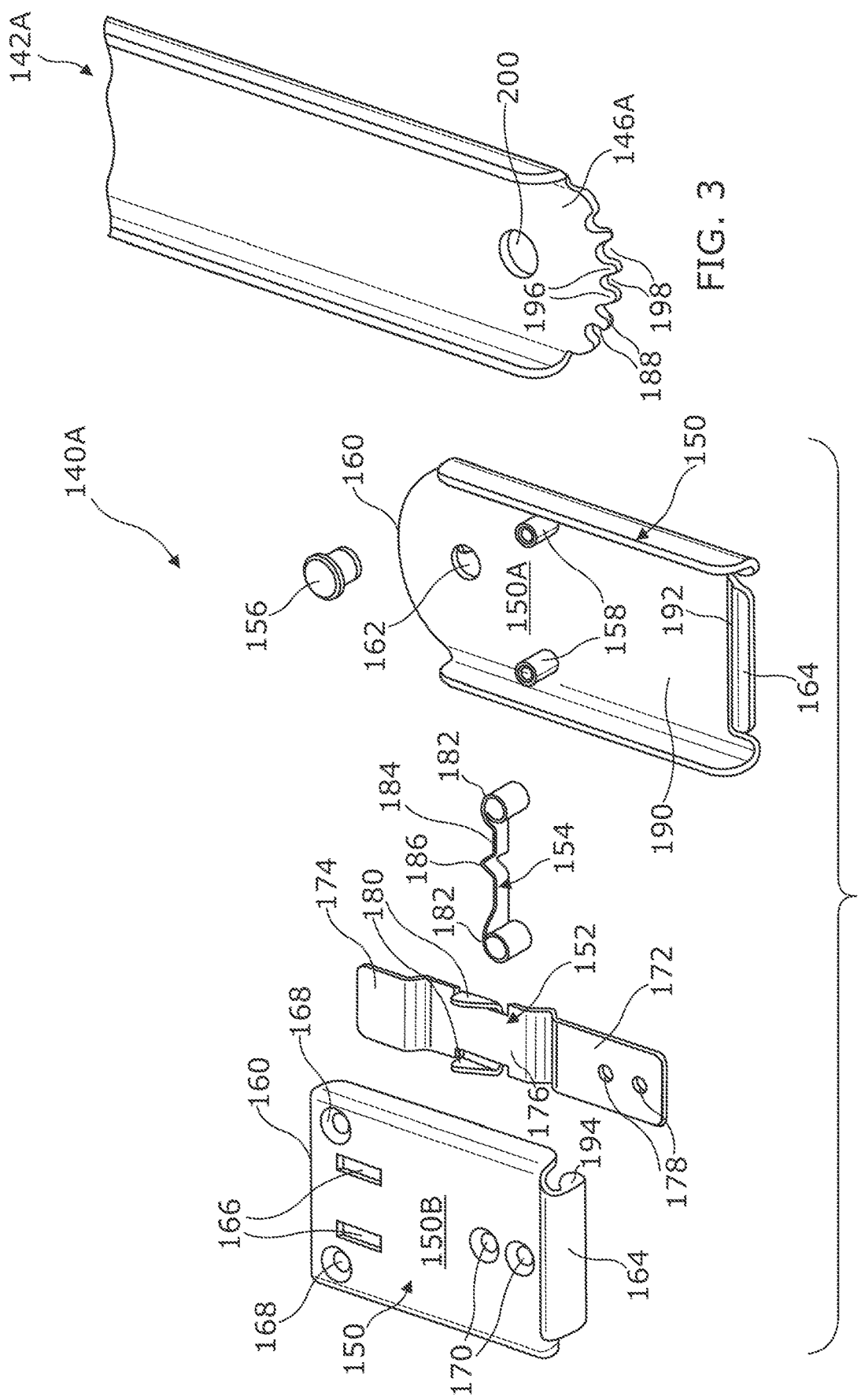

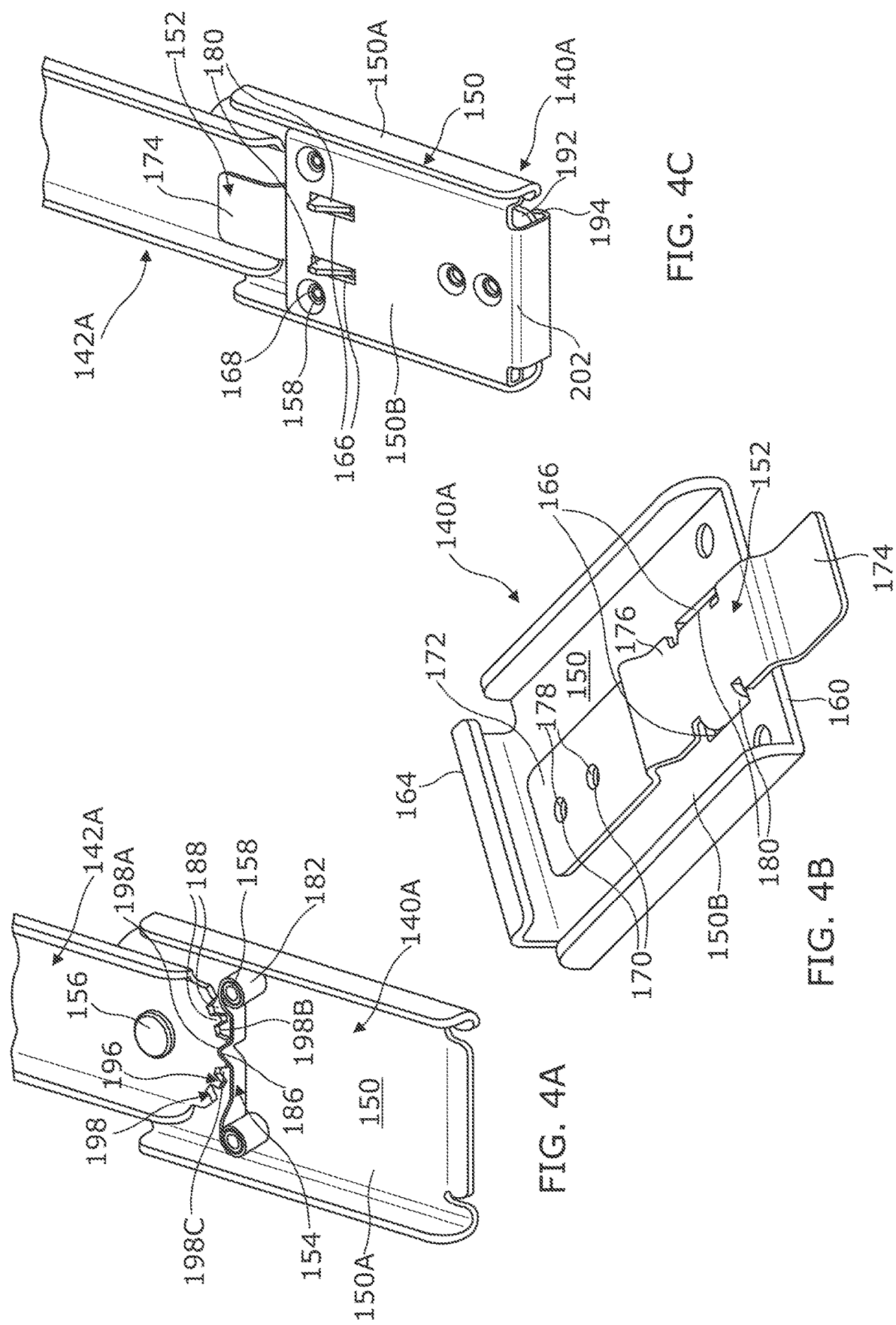

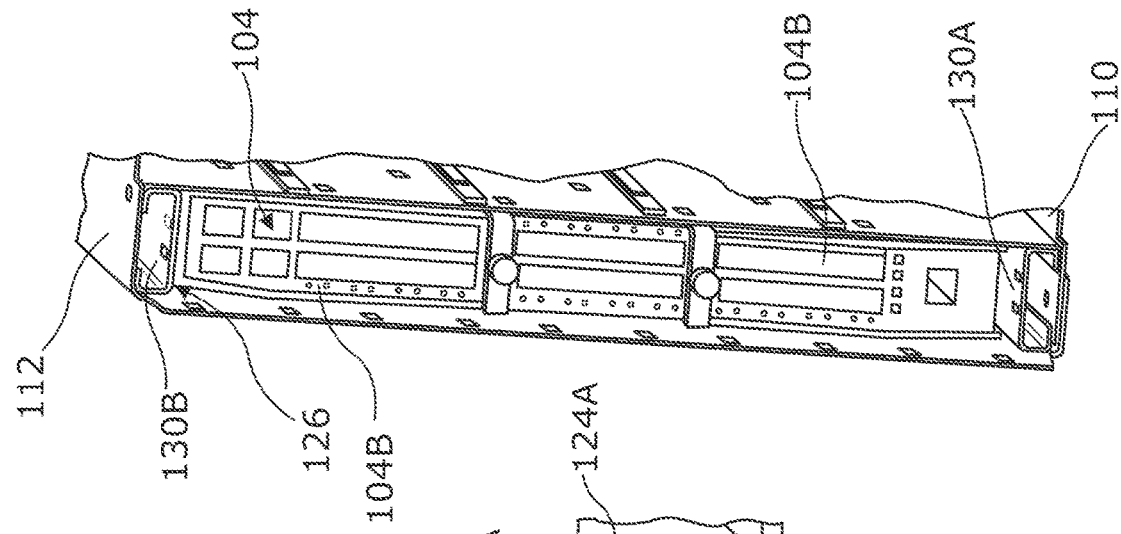
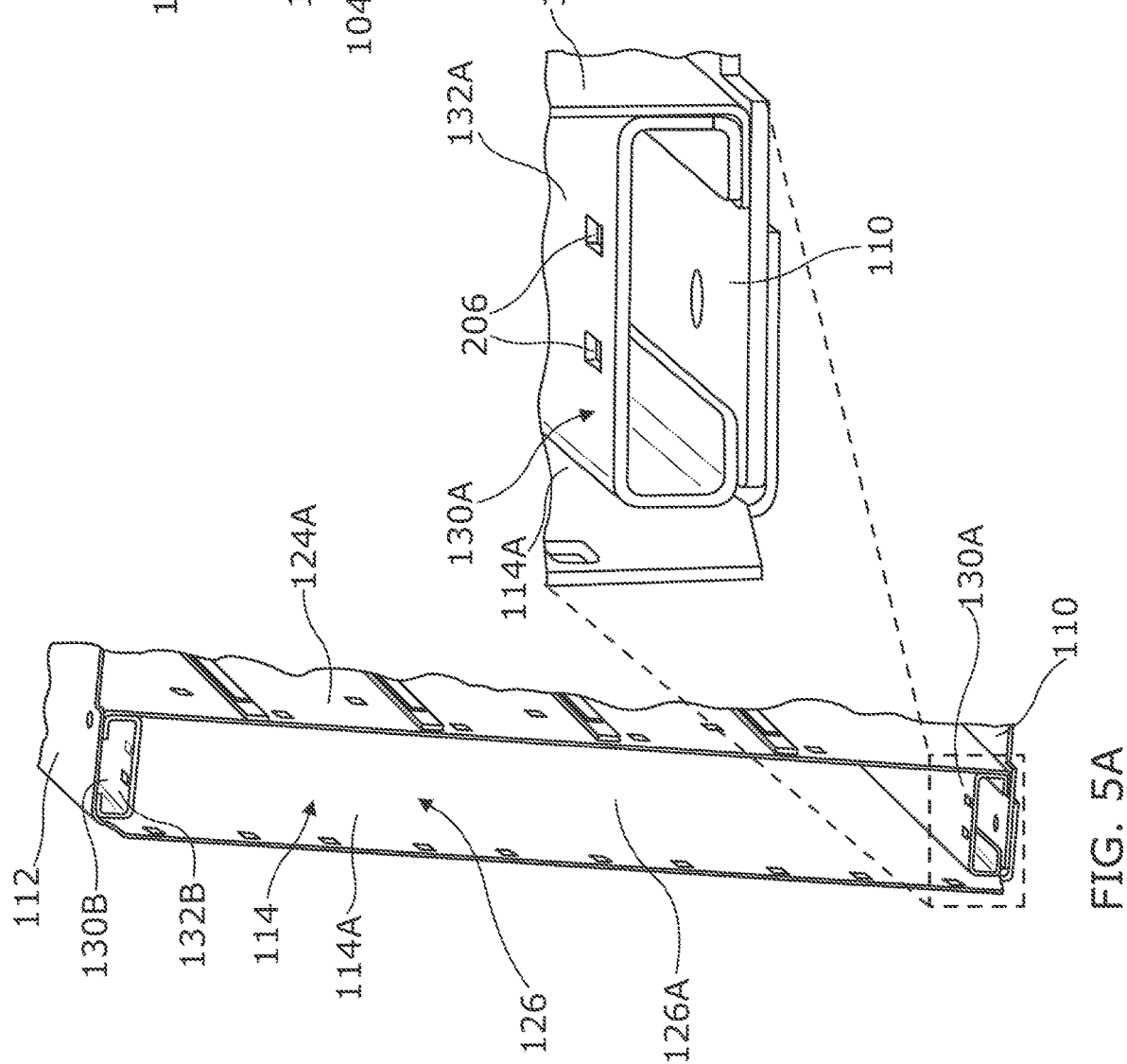

CABLE MANAGEMENT ARM FOR A COMPUTING SYSTEM

BACKGROUND

Computing system, such as a blade server system includes a chassis for receiving and securing a variety of electronic components of the computing system. The electronic components includes blade servers, storage devices, switches, etc. The computing system may further include cables that extend at rear end of the chassis, and connected to the electronic components. The cables may provide power to the electronic components, facilitate communication with other electronic components in the computing system, or routed to other electronic components external to the computing system.

BRIEF DESCRIPTION OF THE DRAWINGS

Various examples will be described below with reference to the following figures.

FIG. 2 illustrates an exploded view of a latch of a pair of latches in the cable management arm of FIGS. 1A-1C according to an example implementation of the present disclosure.

FIG. 3 illustrates a perspective view of a first bar of a pair of first bars in the cable management arm of FIGS. 1A-1C according to an example implementation of the present disclosure.

FIG. 4A illustrates a partially assembled view of the latch of FIG. 2, and the first bar of FIG. 3 according to an example implementation of the present disclosure.

FIG. 4B illustrates another partially assembled view of the latch of FIG. 2 according to an example implementation of the present disclosure.

FIG. 4C illustrates an assembled view of the latch of FIG. 2, and the first bar of FIG. 3 according to an example implementation of the present disclosure.

FIG. 5A illustrates a perspective view of a vertical compartment of the pair of vertical compartments in the chassis of FIGS. 1A-1C according to an example implementation of the present disclosure.

FIG. 5B illustrates a perspective view of the vertical compartment of FIG. 5A hosting the plurality of vertically oriented electronic components of FIGS. 1A and 1C according to an example implementation of the present disclosure.

DETAILED DESCRIPTION

Figure 1A:
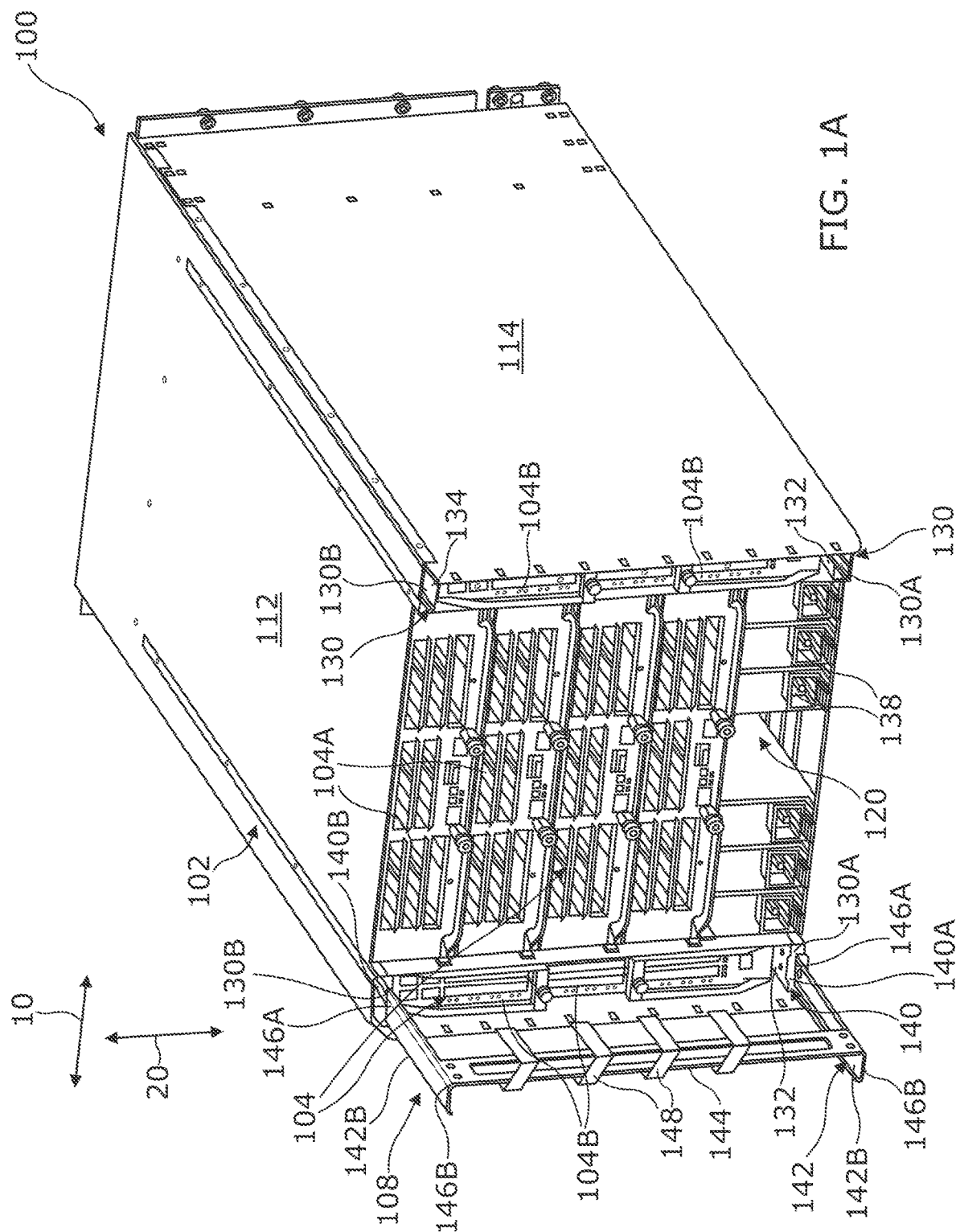
FIG. 1A illustrates a perspective view of a computing system according to the example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As used herein, the term "computing system" may refer to a compute infrastructure having a chassis and a plurality of electronic components for deploying one or more workloads of at least one customer. As used herein, the term "electronic components" may refer to compute devices of the computing system, for example, blade servers, storage devices, switches, etc. As used herein the term "open space" refers to a non-interfering entrance defined by bars of a cable management arm for accessing the one or more electronic components from a rear side of the chassis. As used herein, the term "elastic member" may refer to a flexible element, which may bent from an original position to a deformed position on application of a force, and restored to the original position from the deformed position upon release of the applied force. For example, the elastic member may be a spring finger, or the like. The term "preset position" may refer to a temporarily locked position of a second bar to provide a clearance from cables of the computing system to allow access to one or more electronic components in the chassis of the computing system. Further, the term "front side" of the computing system may refer to a side of the chassis: i) having a display section, and ii) providing easy access to frequently used electronic devices, such as ports, power buttons of the computing system. Similarly, the term "rear side" of the computing system may refer to a mutually opposite side of the front side of the chassis: i) having rarely accessed ports, such as networking ports and ii) concealed from the user when installed in the enclosure of the datacenter environment.

For purposes of explanation, certain examples are described with reference to the components or elements illustrated in FIGS. 1-7. The functionality of the illustrated components or elements may overlap, however, and may be present in a fewer or greater number of elements or components. Further, all or part of the functionality of illustrated elements may co-exist or be distributed among several geographically dispersed locations. Moreover, the disclosed examples may be implemented in various environments and are not limited to the illustrated examples. Further, the sequence of operations performed for locking (securing) the electronic plug within the electronic port described in connection with FIGS. 7A-7B, are an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

A datacenter environment includes multiple computing systems, such as blade server systems for deploying one or more workloads of at least one customer. Each of the multiple computing systems includes a plurality of electronic components and a chassis for receiving and securing the plurality of electronic components. The plurality of electronic components includes blade servers, storage devices, switches, etc. The chassis of each computing system may be disposed adjacent to one another and housed in at least one enclosure of the datacenter environment. The chassis of each computing system may include a plurality of horizontal compartments and a plurality of vertical compartments to optimize an interior space of the chassis for accommodating maximum numbers of electronic components. Further, each computing system includes cables extending at a rear end of the chassis. The cables are generally connected to the plurality of electronic components, and to a source device of the datacenter environment. The source device may include a power supply device for providing power to the plurality of electronic components, or a transceiver device for transmitting and/or receiving signals from the plurality of electronic components. The cables may also be routed to the electronic components external to some of the multiple computing systems. Typically, the cables presents some technical constraints, including restricting movement of the plurality of electronic components in and out of the chassis, and interfering to access one or more electronic components from the rear side of the chassis. Thus, the cables may complicate the access to the one or more electronic components during installing, servicing, or maintenance events of each computing system. Furthermore, an unordered distribution of the cables may cause damage of the cables within the chassis, or misalignment of the disconnected cables to the one or more electronic components. According, there is a requirement for a simple and efficient mechanism to manage the cables within the chassis of each computing system, and also provide clearance from the cables to access the one or more electronic components during installing, servicing, or maintenance events of each computing system.

A technical solution to the aforementioned problems include providing a cable management arm for supporting cables, and providing clearance from the cables to access one or more electronic components of the computing system. In one or more examples, the cable management arm is pivotably connected to a chassis of the computing system, via a pair of latches. In such examples, the pair of latches is detachably coupled to the chassis. In some examples, the cable management arm includes a support bar to provide support to the cables at a rear end of the chassis. For example, the support bar may include one or more hooks for supporting (or holding) the cables. Furthermore, the cable management arm may include a pair of pivot bars for moving the support bar holding the cables to various positions, in order to provide clearance from the cables for accessing the one or more electronic components in the chassis. For example, the pair of pivot bars is connected to the support bar, and pivotable at the rear end of the chassis so as to allow the support bar to move to a plurality of preset positions for providing clearance from the cables to access the one or more electronic components in the chassis. It may be noted herein that the "pair of pivot bars" may also be referred as a "pair of first bars", and the "support bar" may also be referred as a "second bar". The support bar in each preset position of the plurality of preset positions provides the necessary clearance from the cables to easily access the one or more electronic components of the plurality of electronic components in the chassis. In some examples, the plurality of preset positions includes a first preset position and a second preset position. In the first preset position, the support bar provides the clearance from the cables to access vertically oriented electronic components in the chassis. In the second preset position, the support bar provides the clearance from the cables to access horizontally oriented electronic components in the chassis.

The support bar holding the cables may allow the cables to be orderly distributed within the chassis, thereby preventing damages to the cables. Furthermore, the support bar holding the cables, and the pair of pivot bars moving the support bar to various preset positions, may prevent the cables to restrict the movement of the plurality of electronic components in and out of the chassis. Additionally, the pair of pivot bars, and the support bar in each preset position may provide a non-interfering entrance to access one or more electronic components from the rear side of the chassis. Furthermore, the support bar in each preset position may avoid the need to disconnect the cables from the one or more electronic components that are not required to be accessed during the service event. Thus, preventing the misalignment problem associated with reconnecting the disconnected cables after the service event, and switching-off of the one or more electronic components, which are not serviced. Accordingly, the cable management arm may ease the access to the plurality of electronic components, during the at least one of installing, servicing, or maintenance events of each computing system.

Accordingly, the present disclosure describes example implementations of a cable management arm for a computing system. The cable management arm includes a pair of latches, a pair of first bars, and a second bar. The pair of latches is detachably connectable to the chassis. Each first bar has a first end pivotably connected to a respective latch of the pair of latches, and a second end connected to the second bar for defining an open space therebetween. The open space provides a non-interfering entrance for accessing one or more electronic components of a plurality of electronic components from a rear side of the chassis. The second bar supports (or holds) the plurality of cables connected to the plurality of electronic components. The pair of first bars is pivotable relative to the pair of latches such that the second bar is movable to a plurality of preset positions to provide the clearance from the plurality of cables to access the one or more electronic components of the plurality of electronic components from the rear end of the chassis.

Figure 1B:
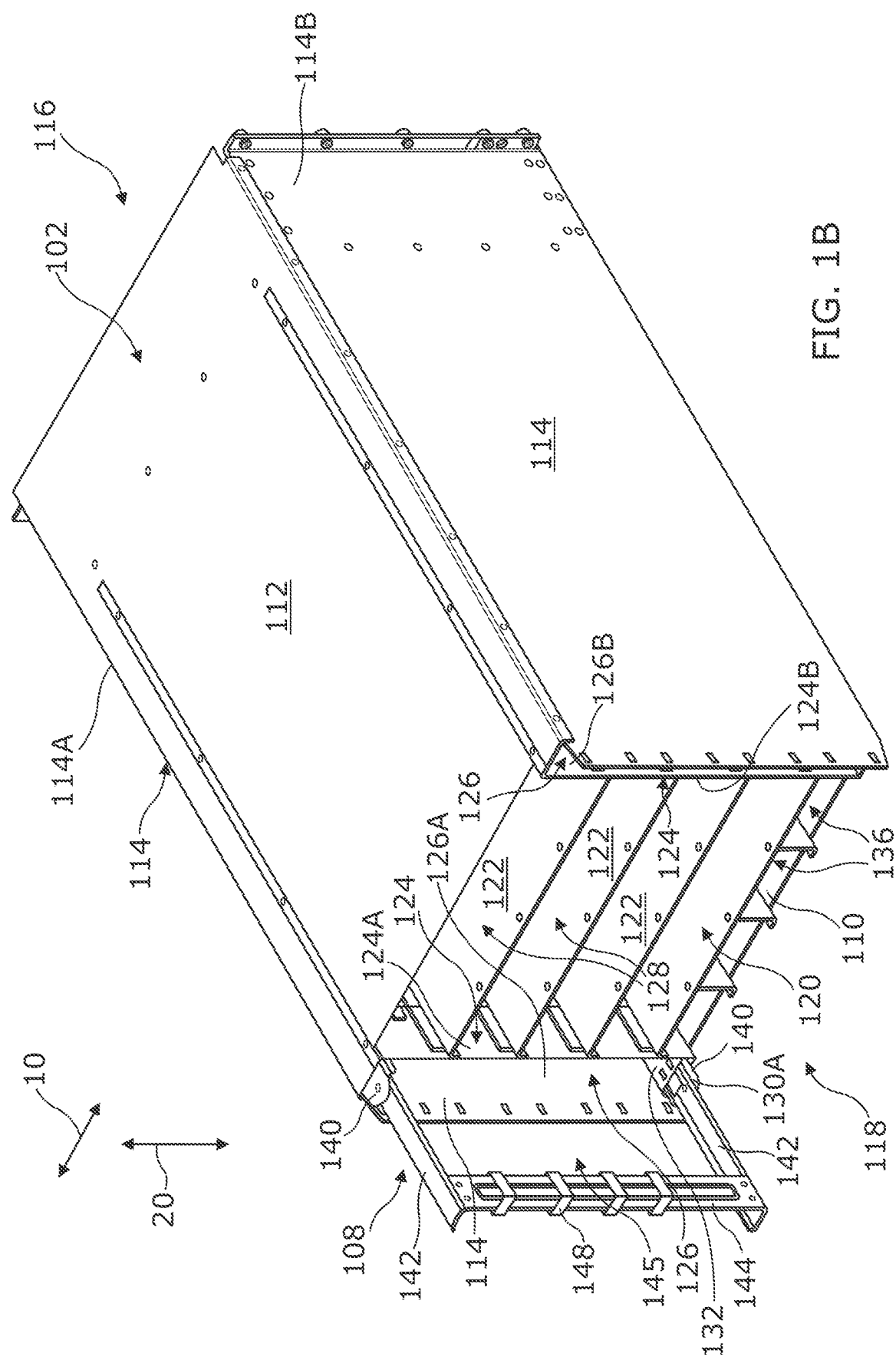
FIG. 1B illustrates a perspective view of a chassis and a cable management arm in the computing system of FIG. 1A according to the example implementation of the present disclosure.
Figure 1C:
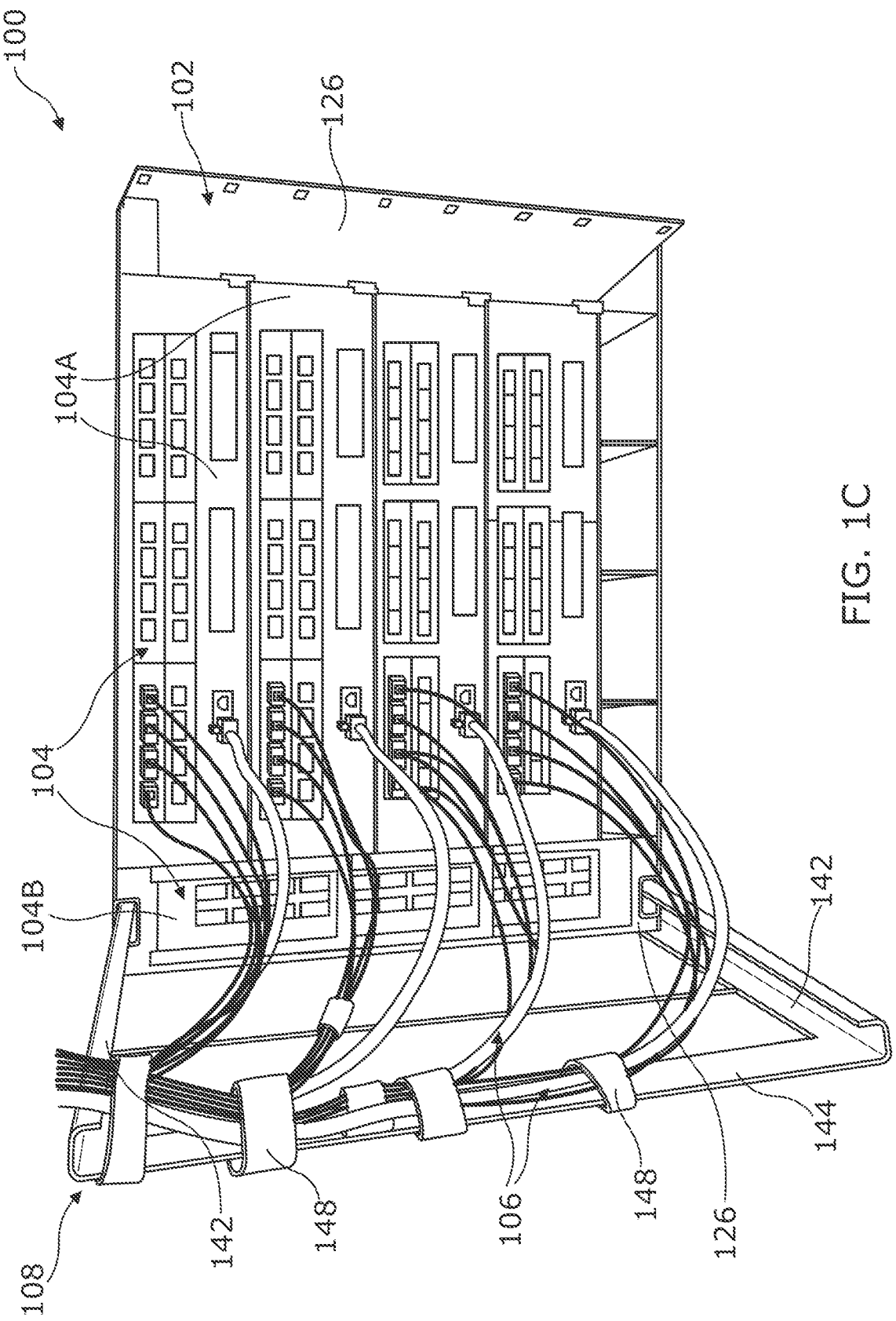
FIG. 1C illustrates a perspective view of the cable management arm supporting a plurality of cables connected to a plurality of electronic components in the computing system of FIGS. 1A-1B according to the example implementation of the present disclosure.

Turning to the Figures, FIG. 1A depicts a perspective view of a computing system 100. FIG. 1B depicts a perspective view of a chassis 102 and a cable management arm 108 in the computing system 100 of FIG. 1A. FIG. 1C depicts a perspective view of the cable management arm 108 supporting a plurality of cables 106 connected to a plurality of electronic components 104 in the computing system 100 of FIGS. 1A-1B. In the description hereinafter, the FIGS. 1A-1C are described concurrently for ease of illustration and description.

In some examples, the computing system 100 is a blade server system. The computing system 100 may be a modular computing system that may allow the plurality of electronic components 104 to be housed in an interior space 120 (as shown in FIGS. 1A-1B) of the chassis 102. Generally, each of the plurality of electronic components 104 is a physically thin component, and typically includes built in electronic devices, such as central processing units (CPUs), memory, integrated network controllers, etc. The computing system 100 is often seen in a datacenter environment, due to its ability to accommodate a lot of such electronic components 104 in the chassis 102, and deploy multiple numbers of the computing system 100 adjacent to one another in at least one enclosure or a rack (not shown) of the datacenter environment. The computing system 100 may be used in the datacenter environment, when there is a need for a high computing power for deploying one or more workloads of at least one customer. The computing system 100 may maximize the available interior space 120 by providing a highest processor capacity per rack unit availability. Further, the computing system 100 may be quickly serviced by allowing one or more electronic components of the plurality of electronic components 104 to be swapped with one or more newer electronic components without taking the computing system 100 offline. Additionally, the computing system 100 may be scaled-up or scaled-down by adding or removing one or more electronic components 104 respectively, so as to meet the computing power required for deploying the one or more workloads. As discussed herein, the computing system 100 includes the chassis 102, the plurality of electronic components 104, the plurality of cables 106, and the cable management arm 108.

Referring to FIG. 1B in particular, the chassis 102 includes a base 110, a cover 112, a pair of peripheral side walls 114, and a front panel (not labeled) located at a front side 116 of the chassis 102. The pair of peripheral side walls 114 (identified individually as a first peripheral side wall 114A and a second peripheral side wall 114B) is spaced apart from one another along a lateral direction 10, and coupled to the base 110 and the cover 112 to define the interior space 120 therebetween. The chassis 102 further includes a plurality of horizontal support walls 122, and a pair of vertical support walls 124 (identified individually as a first vertical support wall 124A and a second vertical support wall 124B).

In some examples, the pair of vertical support walls 124 is spaced apart from one another along the lateral direction 10, disposed within the interior space 120, and coupled to the base 110 and the cover 112 of the chassis 102. For example, each vertical support wall 124 is located adjacent to one peripheral side wall of the pair of peripheral side walls 114 such that a vertical compartment of a pair of vertical compartments 126 (identified individually as a first vertical compartment 126A and a second vertical compartment 126B) is formed between each vertical support wall 124 and the respective peripheral side wall 114. Each vertical compartment of the pair of vertical compartments 126 includes a pair of receptacles 130 (as clearly shown in FIG. 1A (identified individually as a first receptacle 130A and a second receptacle 130B)). For example, the first receptacle 130A of the pair of receptacles 130 is defined between a portion of the base 110, a first vertical support wall 124A, a first peripheral side wall 114A, and a receptacle element 132 (as clearly shown in FIG. 1A). The receptacle element 132 may be coupled to the portion of the base 110, the first vertical support wall 124A, and the first peripheral side wall 114A. Similarly, the second receptacle 130B of the pair of receptacles 130 is formed between a portion of the cover 112, a second vertical support wall 124B, a second peripheral side wall 114B, and another receptacle element 134 (as clearly shown in FIG. 1A). The other receptacle element 134 may be coupled to the portion of the cover 112, the second vertical support wall 124B, and the second peripheral side wall 114B.

The plurality of horizontal support walls 122 is spaced apart from one another along a radial direction 20, disposed within the interior space 120, and coupled to the pair of vertical support walls 124. For example, the plurality of horizontal support walls 122 is located between the pair of vertical support walls 124 such that a plurality of horizontal compartments 128 is formed between each pair of horizontal support walls of the plurality of horizontal support walls 122, or between one horizontal support wall of the plurality of horizontal support walls 122 and the cover 112. In the example of FIG. 1B, the computing system 100 includes four numbers of horizontal compartments 128. In other words, the plurality of horizontal compartments 128 is located between the pair of vertical compartments 126. Further, the chassis 102 includes a plurality of vertical sub-compartments 136 formed between the base 110 and one horizontal support wall of the plurality of horizontal support walls 122.

Referring to FIGS. 1A and 1C, the plurality of electronic components 104 includes blade servers, storage devices, switches, etc. The plurality of electronic components 104 is disposed with the interior space 120 of the chassis 102. For example, the plurality of electronic components 104 includes a plurality of horizontally oriented electronic components 104A, and a plurality of vertically oriented electronic components 104B. In such examples, the plurality of horizontally oriented electronic components 104A is disposed in at least one horizontal compartment of the plurality of horizontal compartments 128. Further, the plurality of vertically oriented electronic components 104B is disposed in at least one vertical compartment of the pair of vertical compartments 126. In some examples, the plurality of vertically oriented electronic components 104B is located between the pair of receptacles 130, for example, between the first and second receptacles 130A, 130B, respectively. In the example of FIGS. 1A and 1C, each of the plurality of horizontally oriented electronic components 104A is a blade server, and each of the plurality of vertically oriented electronic components 104B is a switch (or a network switch device). Further, the chassis 102 may include other electronic devices, such as power supply devices 138, for example, disposed in some of the plurality of vertical sub-compartments 136.

Referring to FIG. 1C, the plurality of cables 106 extending from a source device (not shown) is connected to the plurality of electronic components 104. In the example of FIG. 1C, the plurality of cables 106 are only shown to be connected to the plurality of horizontally oriented electronic components 104A. In other words, the plurality of cables 106 are not shown to be connected to the plurality of vertically oriented electronic components 104B for ease of illustration, and such an illustration should not be construed as a limitation of the present disclosure. Further, the pair of vertically oriented electronic components 104B is shown in only one vertical compartment, for example in the first vertical compartment 126A among the pair of vertical compartments 126. In other words, the plurality of vertically oriented electronic components 104B is not shown in the second vertical compartment 126B among the pair of vertical compartments 126 for ease of illustration, and such an illustration should not be construed as a limitation of the present disclosure.

Referring to FIGS. 1A-1C, the cable management arm 108 is connected to a rear side 118 of the chassis 102. In one or more examples, the cable management arm 108 is used for providing support to the plurality of cables 106, and clearance from the plurality of cables 106 to access one or more electronic components 104 of the computing system 100. In some examples, the cable management arm 108 includes a pair of latches 140 (as clearly shown in FIG. 1A (identified individually as a first latch 140A and a second latch 140B)), a pair of first bars 142 (identified individually as a first bar 142a and another first bar 142b), and a second bar 144.

The pair of latches 140 is detachably connected to at least one vertical compartment among the pair of vertical compartments 126. For example, each latch 140 is slidably inserted into a respective receptacle of the pair of receptacles 130 formed in each vertical compartment 126 to detachably connect each latch 140 to the chassis 102. In the example of FIGS. 1A-1C, only one pair of latches 140, which is detachably connected to one vertical compartment, for example, the first vertical compartment 126A among the pair of vertical compartments 126 is shown for ease of illustration, and such an illustration should not be construed as a limitation of the present disclosure. As mentioned earlier, the pair of latches 140 includes the first latch 140A and the second latch 140B. In such example, the first latch is detachably connected to the first receptacle 130A, and the second latch 140B is detachably connected to the second receptacle 130B. It may be noted herein that the internal elements/mechanism of each latch of the pair of latches 140, and the method of detachably connecting each latch of the pair of latches 140 to the respective receptacle of the pair of receptacles 130 are discussed in greater details below.

The pair of first bars 142 is spaced apart from one another along the radial direction 20. For example, the pair of first bars 142 is spaced apart from one another by the second bar 144 extending therebetween. Further, each first bar of the pair of first bars 142 is pivotably connected to a respective latch of the pair of latches 140. For example, a first bar 142A of the pair of first bars 142 is pivotably connected to the first latch 140A, and another first bar 142B of the pair of first bars 142 is pivotably connected to the second latch 140B. In the examples of FIGS. 1A-1C, each first bar of the pair of first bars 142 includes a first end 146A pivotably connected to the respective latch of the pair of latches 140, and a second end 146B connected to the second bar 144.

The second bar 144 interconnects the pair of first bars 142 so as to define an open space 145 therebetween the pair of first bars 142 and the second bar 144. In one or more examples, the open space 145 may refer to a non-interfering see-through open area defined between the pair of first bars 142 and the second bar 144. In some examples, the cable management arm 108 further includes a plurality of support elements 148 spaced apart from one another along the radial direction 20, and coupled to the second bar 144. In some examples, each support element of the plurality of support elements 148 is a hook, a velcro, etc., without deviating from the scope of the present disclosure. Referring to the example of FIG. 1C, the plurality of support elements 148 may allow the plurality of cables 106 to pass through, and hold them together in order to support the plurality of cables 106 extending from the source device and connected to the plurality of electronic components 104. The plurality of support elements 148 holding the plurality of cables 106 may allow the cables 106 to be orderly distributed within the chassis 102, thereby preventing damages to the plurality of cables 106.

Figure 6:
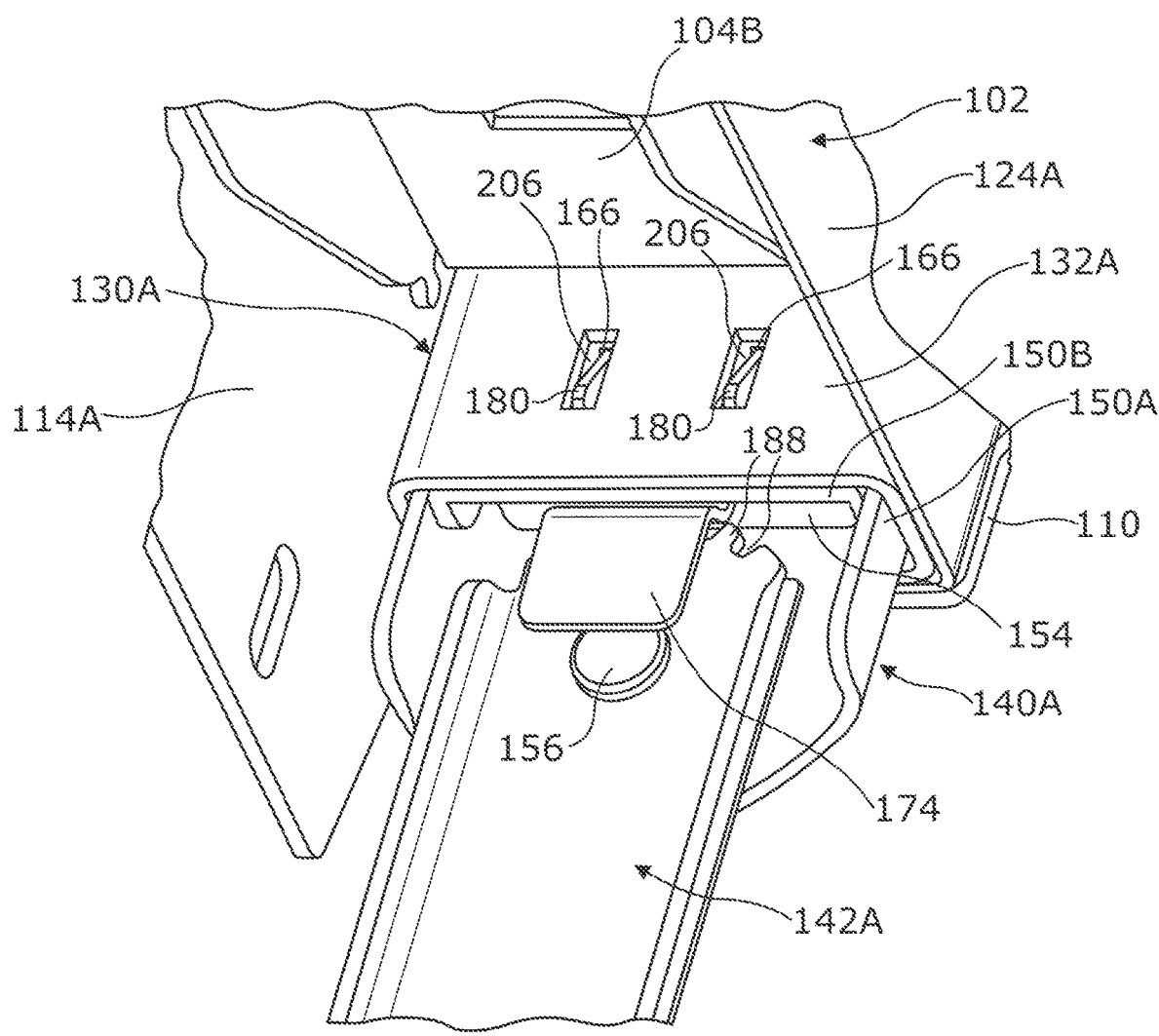
FIG. 6 illustrates a perspective view of the first bar of FIG. 3 pivotably connected to the latch of FIG. 2 that is detachably connected to the first receptacle of the vertical compartment of FIGS. 5A-5B according to an example implementation of the present disclosure.
Figure 7A:
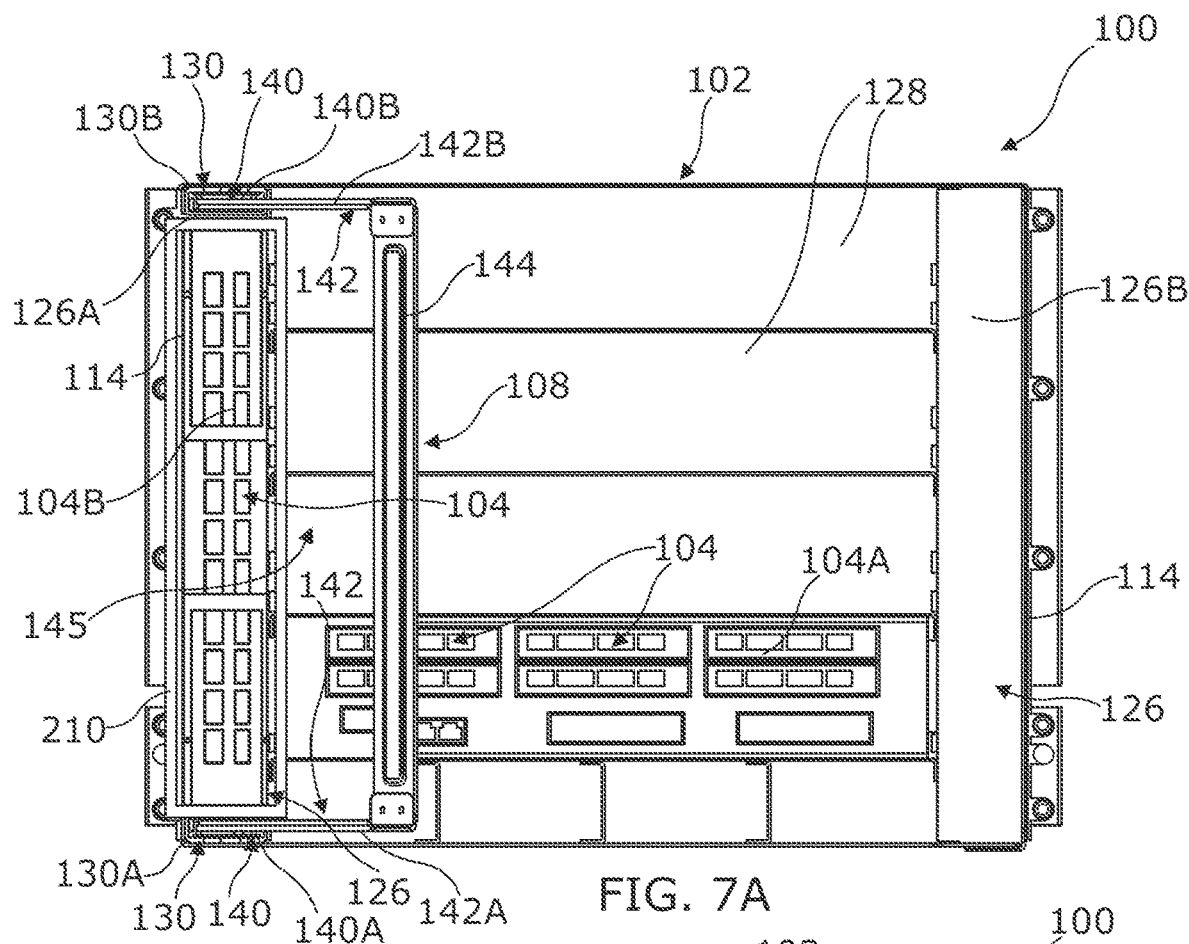
FIG. 7A illustrates a block diagram of the computing system of FIGS. 1A-1C having a second bar of a cable management arm in a first preset position of a plurality of preset positions according to an example implementation of the present disclosure.
Figure 7B:
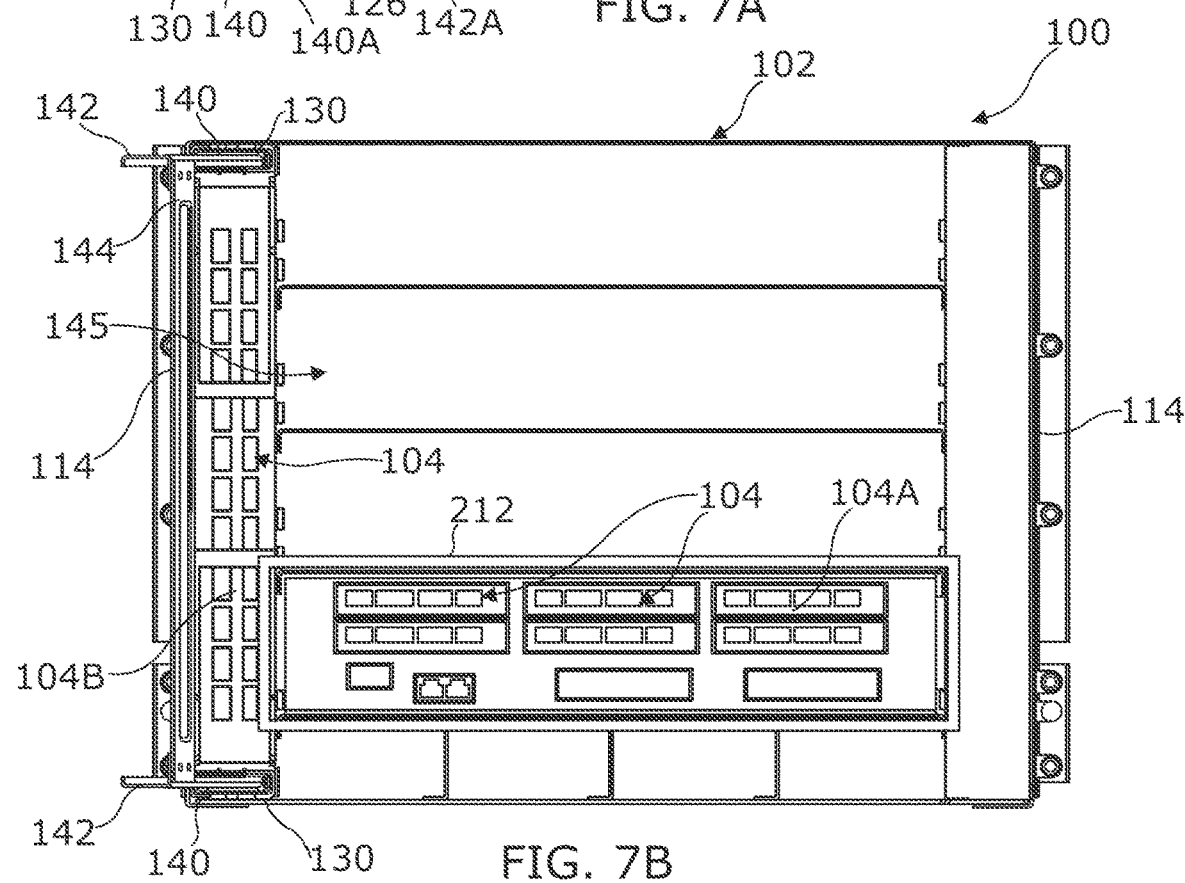
FIG. 7B illustrates a block diagram of the computing system of FIGS. 1A-1C having a second bar of a cable management arm in a second preset position of a plurality of preset positions according to an example implementation of the present disclosure.

In one or more examples, the pair of first bars 142 is pivotable relative to the pair of latches 140 such that the second bar 144 is movable to a plurality of preset positions (as shown in FIGS. 6-7). It may be noted herein that the second bar 144 is in a default position in the examples of FIGS. 1A-1C. For example, the second bar 144 is positioned substantially parallel to the pair of peripheral side walls 114 in the default position. Referring to the example of FIG. 1C, the plurality of cables 106 connected to the plurality of horizontally oriented electronic components 104A may typically interfere, when tried to access the plurality of vertically oriented electronic components 104b from the rear side 118 of the chassis 102. Therefore, some of the plurality of cables 106 may complicate the access to the plurality of vertically oriented electronic components 104B, during at least one of installing, servicing, or maintenance events of each computing system 100. To address such issues, the plurality of cables 106 connected to the plurality of horizontally oriented electronic components 104A may have to be disconnected to obtain the access to the plurality of vertically oriented electronic components 104B. In some examples, the second bar 144 moved to one preset position among the plurality of present positions may provide the non-interfering entrance to access the plurality of vertically oriented electronic components 104b via the interior space 120. Thus, the second bar 144 moved to the one preset position may avoid the need for the cables to be disconnected from the plurality of horizontally oriented electronic components 104A. Thereby, preventing the misalignment problem associated with reconnecting the disconnected cables after the service event, and switching-off of the plurality of horizontally oriented electronic components 104A to provide the access to the plurality of vertically oriented electronic components 104B. Accordingly, the cable management arm 108 may ease the access to the plurality of electronic components 104, during at least one of installing, servicing, or maintenance events of each computing system 100. Furthermore, the second bar 144 holding the cables 106, and the pair of first bars 142 pivotably moving the second bar 144 to various preset positions, may prevent the cables 106 to restrict the movement of the plurality of electronic components 104 in and out of the chassis 102.

FIG. 2 depicts an exploded view of a latch, for example, a first latch 140A of a pair of latches 140 of the cable management arm 108 in FIGS. 1A-1C. In one or more examples, the first latch 140A includes a housing 150, a cantilever beam 152, and an elastic member 154.

The housing 150 is formed by a base portion 150A, and a cover portion 150B. For example, the cover portion 150B is seated on the base portion 150A to define a hollow cavity 190 therebetween. In one or more examples, the hollow cavity 190 may accommodate the other components of the first latch 140A, e.g., the cantilever beam 152 and the elastic member 154. In one or more examples, the housing 150 has a distal end 160, and a front end 164. The front end 164 of the housing 150 has a curved outer structure in order to allow the first latch 140A to be slidably inserted into a receptacle, for example, the first receptacle 130A of the pair of receptacles 130 (as shown in FIG. 1A).

The base portion 150A includes a pivot pin 156, and a pair of pillars 158 (or pair of hollow pillars). For example, the pivot pin 156 is located proximate to the distal end 160 of the housing 150, and coupled to a through hole 162 formed in the base portion 150A. The pair of pillars 158 is spaced apart from one another, disposed upstream relative to the pivot pin 156, and coupled to the base portion 150A. In some examples, each pillar of the pair of pillars 158 is a hollow pillar having threads.

The cover portion 150B includes a pair of first through slots 166 formed proximate to the distal end 160 of the housing 150, a pair of fastener slots 168 having threads, formed adjacent to the pair of first through slots 166, and a pair of first rivet slots 170 formed proximate to the front end 164 of the housing 150. In some examples, the front end 164 of the housing 150 includes locking features, for example, the base portion 150A has a linear protruded portion 192, and the cover portion 150B has a curved protruded portion 194. In such examples, when the cover portion 150B is mounted on the base portion 150A, the linear protruded portion 192 seats over the curved protruded portion 194, thereby prevent detachment of the cover portion 1506 from the base portion 150A. In some examples, each first fastener slot of the pair of first fastener slots 166 has a diameter that is substantially equal to a diameter of each hollow pillar of the pair of pillars 158.

The cantilever beam 152 has a fixed end portion 172, a free end portion 174, and a body portion 176 connecting the fixed end portion 172 to the free end portion 174. The fixed end portion 172 may be located proximate to the front end 164 of the housing 150, and the free end portion 174 may be located proximate to the distal end 160 of the housing 150. Further, the free end portion 174 is maintained at an elevated height in comparison with the fixed end portion 172. In some examples, the fixed end portion 172 includes a pair of second rivet slots 178, and the body portion includes a pair of prongs 180. In some examples, each third fastener slot of the pair of second rivet slots 178 has a diameter that is substantially equal to a diameter of each second fastener slot of the pair of first rivet slots 170. Each prong of the pair of prongs 180 has inclined height, where the height is gradually increased from a side corresponding to the fixed end portion 172 to a side corresponding to the free end portion 174. Further, each prong of the pair of prongs 180 has a width that is substantially equal to a width of the pair of first through slots 166 in the cover portion 150B.

The elastic member 154 is a flexible member, such as a spring finger. In one or more examples, the elastic member 154 has a pair of hollow cylindrical portions 182, and a body portion 184 connecting the pair of hollow cylindrical portions 182. In some examples, each cylindrical portion of the pair of hollow cylindrical portions 182 has a diameter that is substantially equal to a diameter of each hollow pillar of the pair of pillars 158. The body portion 184 has a protruded section 186 formed at a substantially mid-section of the body portion 184. In some examples, the protruded section 186 may face a respective first bar of the pair of first bars 142 (as shown in FIGS. 1A-1C).

FIG. 3 depicts a first bar 142A of a pair of first bars 142 of the cable management arm 108 in FIGS. 1A-1C. In some examples, a first end 146A of a first bar 142A includes a gear feature 188 (e.g., a geared portion) having spaced apart teeth 196. For example, a space 198 is formed between each mutually adjacent teeth 196. In the example FIG. 3, the gear feature 188 includes four teeth 196 and five spaces 198. The first end 146A further includes a through-hole 200. In some examples, the through-hole 200 has a diameter that is substantially equal to a diameter of the pivot pin 156 (as shown in FIG. 2).

FIG. 4A depicts a partially assembled view of a latch, for example, a first latch 140A of the pair of latches 140 of FIG. 2, and the first bar 142A of the pair of first bars 142 of FIG. 3. In some examples, the first bar 142A is first disposed on the base portion 150A of the housing 150 such that the through-hole 200 (as shown in FIG. 3) of the first bar 142A is aligned with the pivot pin 156 in the base portion 150A. Further, the pivot pin 156 is protruded into the through-hole 200 of the first bar 142A so as to pivotably connect the first bar 142A to the first latch 140A.

In some example, the elastic member 154 is further disposed within the housing 150. For example, the elastic member 154 is mounted on the base portion 150A such that each hollow cylindrical portion of the pair of hollow cylindrical portions 182 is mounted on a respective pillar of the pair of pillars 158 (hollow pillars). In such examples, a space 198 in the gear feature 188 is engaged to the protruded section 186 in the elastic member 154 for defining one preset position of a plurality of preset positions to the second bar 144 (as shown in FIGS. 1A-1C). In the example of FIG. 4A, the space 198A of the gear feature 188 is engaged with the protruded section 186 to define a default preset position among the plurality of preset positions to the second bar 144. In some other examples, the protruded section 186 when engaged with an adjacent space 198B (to the space 198) of the gear feature 188 defines a first preset position among the plurality of preset positions to the second bar 144. Similarly, the protruded section 186 when engaged with another space 198C (to the space 198) of the gear feature 188 defines a second preset position among the plurality of preset positions to the second bar 144. In one or more examples, the protruded section 186 of the elastic member 154 deforms upon rotation of the gear feature 188 caused by the pivotal motion of each first bar 142. Later, the protruded section 186 engages to adjacent space (for example, to the space 198B or 198C from the space 198A) in the gear feature 188 for shifting the second bar 144 from the default position to the first preset position or to the second preset position, respectively.

FIG. 4B depicts another partially assembled view of the first latch 140A of the pair of latches 140 of FIG. 2. In the example of FIG. 4B, the cantilever beam 152 is disposed within the cover portion 150B of the housing 150. For example, the cantilever beam 152 is positioned such that: i) a fixed end portion 172 of the cantilever beam 152 faces a front end 164 of the housing 150, ii) a free end portion 174 of the cantilever beam 152 faces a distal end 160 of the housing 150, and protrudes outside the cover portion 150B, iii) the pair of first rivet slots 170 aligns with the pair of second rivet slots 178, and iv) the pair of prongs 180 protrudes outside the cover portion 150B via the pair of first through slots 166 (clearly shown in FIG. 4C). In such examples, the cantilever beam 152 is coupled to the cover portion 150B by fastening a pair of rivets (not shown) via the pair of first and second rivet slots 170, 178, respectively.

FIG. 4C depicts an assembled view of the first latch 140A of the pair of latches 140 of FIG. 2, and the first bar 142A of the pair of first bars 142 of FIG. 3. In the example of FIG. 4C, the cover portion 150B having the cantilever beam 152, as shown in FIG. 4B, is seated on the base portion 150A having the elastic member 154 as shown in FIG. 4A to form the housing 150 of the first latch 140A. In some examples, seating of the cover portion 150B on the base portion 150A causes: i) the pair of fastener slots 168 to align with the pair of pillars 158 (hollow pillars), and position the cantilever beam 152 is positon over the elastic member 154. In other words, the elastic member 154 is located below the cantilever beam 152 such that a body portion 176 (labeled in FIG. 4B) of the cantilever beam 152 is spaced apart from a body portion 184 (labeled in FIG. 2) of the elastic member 154 in a relaxed state (resting state) of the cantilever beam 152. In such examples, the cover portion 150B is coupled to the base portion 150A by fastening a pair of fasteners (not shown) via the pair of fastener slots 168, and the pair of hollow pillars 158. In such examples, the linear protruded portion 192 of the base portion 150A seats over the curved protruded portion 194 of the cover portion 150B, thereby preventing detachment of the cover portion 150B from the base portion 150A. Further, the front end 164 of the housing 150 has a curved outer structure 202 in order to allow the first latch 140A to be slidably inserted into the first receptacle 130A of the pair of receptacles 130 (as shown in FIG. 1A).

Figure 4D:
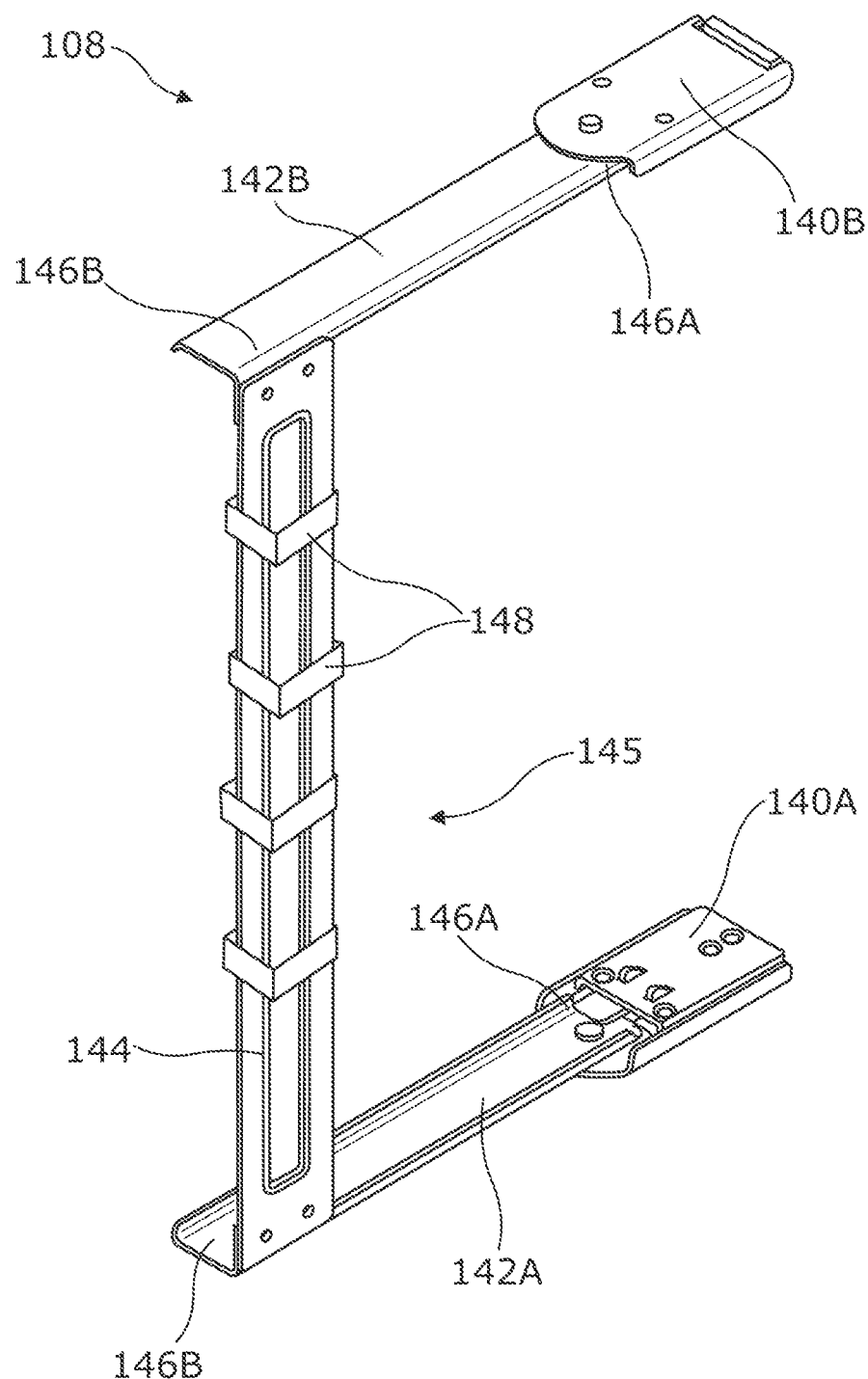
FIG. 4D illustrates a perspective view of the cable management arm having the pair of latches of FIG. 2, the pair of first bars of FIG. 3, and the second bar according to an example implementation of the present disclosure.

FIG. 4D depicts the cable management arm 108 of the computing system 100 of FIGS. 1A-1C. As discussed hereinabove, the cable management arm 108 includes a pair of latches 140, a pair of first bars 142, and a second bar 144. The pair of first bars 142 is spaced apart from each other by the second bar 144 extending therebetween. Further, each first bar of the pair of first bars 142 has a first end 146A pivotably connected to a respective latch 140. For example, the pair of first bars 142 has a first bar 142A having the first end 146A pivotably connected to a first latch 140A of the pair of latches 140. Further, the pair of first bars 142 has another first bar 142B having the first end 146A pivotably connected to a second latch 140B of the pair of latches 140. Additionally, each first bar of the pair of first bars 142 has a second end 146B connected to the second bar 144 for defining an open space 145 therebetween. For example, the first bar 142A of the pair of first bars 142 has the second end 146B connected to the second bar 144, and the other first bar 142B of the pair of first bars 142 has the second end 146B connected to the second bar 144. In some examples, the second bar 144 has a plurality of supporting elements 148 to support the plurality of cables 106 (as shown in FIG. 1C). In one or more examples, the pair of first bars 142 is pivotable relative to the pair of latches 140 such that the second bar 144 is movable to a plurality of preset positions (as shown in FIGS. 7A and 7B).

FIG. 5A depicts a perspective view of a vertical compartment, for example, a first vertical compartment 126A of a pair of vertical compartments 126 in the chassis 102 of FIGS. 1A-1C. The first vertical compartment 126A is defined between one peripheral side wall, for example, a first peripheral side wall 114A, and one vertical support wall, for example, a first vertical support wall 124A, a portion of the cover 112 and the base 110. The first vertical compartment 126A includes a pair of receptacles 130, for example, a first receptacle 130A and a second receptacle 130B. In some examples, the first receptacle 130A is formed between a portion of the first peripheral side wall 114A, the first vertical support wall 124A, the base 110, and a first receptacle element 132A. Similarly, the second receptacle 130B is formed between a portion of the first peripheral side wall 114A, the first vertical support wall 124A, the cover 112, and a second receptacle element 132B. In one or more examples, each receptacle wall of the first and second receptacles 130A, 130B includes a pair of second through slots 206. In some examples, each second slot of the pair of second through slots 206 may have a width that is substantially equal to a width of each first through slot of the pair of first through slots 166 (as shown in FIG. 2).

FIG. 5B depicts a perspective view of the first vertical compartment 126A of FIG. 5A hosting the plurality of vertically oriented electronic components 104B of FIGS. 1A and 1C. In some examples, the plurality of vertically oriented electronic components 104B is disposed within the first vertical compartment 126A and located between the pair of receptacles 130, for example, between the first receptacle 130A and the second receptacle 130B. Each receptacle of the pair of receptacles 130 may slidably receive a respective latch of the pair of latches 140 (as shown in FIG. 4C) to detachably couple the respective latch of the pair of latches 140 to the chassis 102.

FIG. 6 depicts a perspective view of the first bar 142A of FIG. 3 pivotably connected to the first latch 140A of FIG. 2 that is detachably connected to the first receptacle 130A of the vertical compartment of FIGS. 5A-5B. In some examples, an insertion force is applied on the first latch 140A to slidably insert the first latch 140A into the first receptacle 130A. For example, the front end 164 (as shown in FIG. 2) of the first latch 140A is slidably inserted into the first receptacle 130A to detachably connect the first latch 140A to the first receptacle 130A. In such examples, upon slidably inserting the first latch 140A into the first receptacle 130A, the pair of prongs 180 contacts an outer wall of the first receptacle element 132A and moves to depressed position by bending downwards through the pair of first through slots 166 into the hollow cavity 190 (as shown in FIG. 2) of the latch housing 150. The pair of prongs 180 remains in the depressed position until the pair of first through slots 166 is aligned with the pair of second through slots 206. In such examples, once the pair of first through slots 166 is aligned with the pair of second through slots 206, the pair of prongs 180 moves to a relaxed position from the depressed position, by protruding outside the cover portion 150B and the first receptacle element 132A (i.e., protruding upwards) via the pair of first through slots 166 and the pair of second through slots 206. Thus, the pair of prongs 180 is engaged with the first receptacle element 132A to connect the first latch 140A to the chassis 102.

In some examples, the first latch 140A may be disconnected from the first receptacle 130A by first applying the depression force on the free end portion 174 of the cantilever beam 152. The application of the depression force causes the cantilever beam 152 to move to a biased state form the relaxed state of the cantilever beam 152, by moving the body portion 176 (labeled in FIG. 4B) downwards until it contacts the body portion 184 (labeled in FIG. 3) of the elastic member 154. Hence, the application of the depression force on the free end portion 174 causes the pair of prongs 180 to move to the depressed position from the relaxed position by bending downwards through the pair of second and first through slots 206, 166 into the hollow cavity 190 of the latch housing 150. Thus, the pair of prongs 180 is disengaged from the first receptacle element 132A. In some examples, when the pair of prongs 180 is disengaged from the first receptacle element 132A, a withdrawal force may be applied on the first latch 140A to detach the first latch 140A from the first receptacle 130A of the chassis 102.

FIG. 7A depicts a block diagram of the computing system 100 of FIGS. 1A-1C having a second bar 144 of a cable management arm 108 in a second preset position of a plurality of preset positions.

As discussed in the example of FIGS. 1A-1C, the computing system 100 includes a chassis 102, a plurality of electronic components 104, a plurality of cables (not shown), and a cable management arm 108. It may be noted herein, that a plurality of cables 106 (as shown in FIG. 1C) is not shown in the example of FIG. 7A for ease of illustration and such an illustration should not be construed as a limitation of the present disclosure. Further, the computing system 100 is shown to include only one cable management arm 108 for ease of illustration and such an illustration should not be construed as a limitation of the present disclosure.

The chassis 102 has a pair of vertical compartments 126 and a plurality of horizontal compartments 128. In some examples, the pair of vertical compartments 126 includes a first vertical compartment 126A and a second vertical compartment 126B. The plurality of electronic components 104 includes a plurality of horizontally oriented electronic components 104A, and a plurality of vertically oriented electronic components 104B. The cable management arm 108 has a pair of latches 140, a pair of first bars 142, and a second bar 144. The pair of latches 140 includes a first latch 140A, and a second latch 140B. The pair of first bars 142 includes a first bar 142A, and another first bar 142B. As discussed hereinabove, the pair of first bars is pivotably connected to the pair of latches 140. For example, the first bar 142A is pivotably connected to the first latch 140A, and the other first bar 142B is pivotably connected to the second latch 140B. The second bar is connected to the pair of first bars 142 to define an open space 145 therebetween. The pair of latches 140 is detachably connected to the chassis 102, for example, to the pair of receptacles 130 formed in the vertical compartment 126 of the chassis 102. In the example of FIG. 7A, the first latch 140A is detachably connected to a first receptacle 130A and the second latch 140B is detachably connected to a second receptacle 130B.

The pair of first bars 142 is pivotable relative to the pair of latches 140 such that the second bar 144 is movable to a plurality of preset positions. In the example of FIG. 7A, the second bar 144 is moved to a first preset position from one of a default position (as shown in FIGS. 1A-1C) or a second preset position (as shown in FIG. 7B). In some examples, in the first preset position, the second bar 144 is aligned substantially parallel to a pair of peripheral side walls 114 of the chassis 102. In one or more examples, in the first preset position, the second bar 144 provides a clearance 210 from the plurality of cables to access the vertically oriented electronic components 104B among the plurality of electronic components 104 that is disposed between the pair of latches 140 via the open space 145.

FIG. 7B depicts a block diagram of the computing system 100 of FIGS. 1A-1C having a second bar 144 of a cable management arm 108 in a second preset position of a plurality of preset positions. As discussed in the example of FIGS. 1A-1C, the computing system 100 includes a chassis 102, a plurality of electronic components 104, a plurality of cables (not shown), and a cable management arm 108. It may be noted herein, that a plurality of cables 106 (as shown in FIG. 1C) is not shown in the example of FIG. 7A for ease of illustration and such an illustration should not be construed as a limitation of the present disclosure. Further, the computing system 100 is shown to include only one cable management arm 108 for ease of illustration and such an illustration should not be construed as a limitation of the present disclosure.

It may be noted herein that the example of FIG. 7B is substantially similar to the example of FIG. 7A except for the preset position of the second bar 144. In one or more examples, the pair of first bars 142 is pivotable relative to the pair of latches 140 such that the second bar 144 is movable to a plurality of preset positions. In the example of FIG. 7B, the second bar 144 is moved to a second preset position from one of a default position (as shown in FIGS. 1A-1C) or the first preset position (as shown in FIG. 7A). In some examples, in the second preset position, the second bar 144 is aligned substantially perpendicular to a pair of peripheral side walls 114 of the chassis 102. In one or more examples, in the second preset position, the second bar 144 provides a clearance 212 from the plurality of cables to access the horizontally oriented electronic components 104A among the plurality of electronic components 104 that is disposed between the pair of latches 140 via the open space 145.

Various features as illustrated in the examples described herein may be implemented in a cable management arm of a computing system. A support bar of the cable management arm holding cables may allow the cables to be orderly distributed within the chassis, thereby preventing damages to the cables. Furthermore, the support bar holding the cables, and a pair of pivot bars of the cable management arm pivotably moving the support bar to various preset positions, may prevent the cables to restrict the movement of a plurality of electronic components in and out of a chassis of the computing system. Additionally, the pair of pivot bars, and the support bar in each preset position may provide a non-interfering entrance to access one or more electronic components from a rear side of the chassis. Furthermore, the support bar in each preset position may avoid the need to disconnect the cables from the one or more electronic components that are not required to be accessed during the service event. Thus, preventing the misalignment problem associated with reconnecting the disconnected cables after the service event, and switching-off of the one or more electronic components, which are not serviced.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A cable management arm comprising:
a pair of latches detachably connectable to a chassis of a computing system, wherein each latch comprises a housing having a pivot pin and a pair of pillars located on a base portion of the housing, a pair of first through slots located on a cover portion of the housing, a cantilever beam having a pair of prongs, and an elastic member; and
a pair of first bars spaced apart from each other by a second bar extending therebetween,
wherein each of the pair of first bars has a first end pivotably connected to a respective latch of the pair of latches and a second end connected to the second bar for defining an open space between the pair of first bars and the second bar, wherein the second bar is configured to support a plurality of cables connected to a plurality of electronic components of the computing system in a connected state of the pair of latches to the chassis, and wherein the pair of first bars is pivotable relative to the pair of latches such that the second bar is movable to a plurality of preset positions.

2. The cable management arm of claim 1, wherein the pivot pin protrudes into a through-hole of a respective first bar to pivotably connect the respective first bar to the respective latch.

3. The cable management arm of claim 1, wherein the cantilever beam is disposed within the housing and coupled to the housing such that the pair of prongs protrudes outside the housing via the pair of first through slots, and a free end portion of the cantilever beam protrudes outside the cover portion of the housing, and wherein the pair of prongs further protrudes outside a pair of second through slots of the chassis to detachably connect each latch to the chassis.

4. The cable management arm of claim 1, wherein the elastic member comprises a protruded section facing a respective first bar, and wherein the elastic member is disposed below the cantilever beam, and each end portion of the elastic member is mounted on a respective pillar of the pair of pillars.

5. The cable management arm of claim 4, wherein the first end of each of the pair of first bars comprises a gear feature having spaced apart teeth, where a space is formed between each mutually adjacent teeth.

6. The cable management arm of claim 5, wherein the space of the gear feature is engaged to the protruded section of the elastic member for defining one preset position of the plurality of preset positions to the second bar.

7. The cable management arm of claim 5, wherein the protruded section of the elastic member, deforms upon rotation of the gear feature caused by a pivotal motion of each first bar, and engages to adjacent space of the gear feature for shifting the second bar from a first preset position to a second preset position of the plurality of preset positions.

8. The cable management arm of claim 1, wherein the plurality of preset positions comprises a first preset position, and wherein, in the first preset position, the second bar provides a clearance from the plurality of cables to access a vertically oriented electronic component among the plurality of electronic components, that is disposed between the pair of latches via the open space.

9. The cable management arm of claim 8, wherein the plurality of preset positions comprises a second preset position, and wherein, in the second preset position, the second bar provides the clearance from the plurality of cables to access a horizontally oriented electronic component among the plurality of electronic components, that is disposed adjacent the pair of latches via the open space.

10. A computing system comprising:
a chassis comprising a pair of vertical compartments and a plurality of horizontal compartments located between the pair of vertical compartments, wherein each of the pair of vertical compartments comprises a pair of receptacles spaced apart from each other;
a plurality of electronic components comprising a vertically oriented electronic component disposed in at least one of the pair of vertical compartments and a horizontally oriented electronic component disposed in at least one of the plurality of horizontal compartments;
a plurality of cables routed into the chassis and connected to the plurality of electronic components; and
a cable management arm comprising:
a pair of latches, each slidably insertable into a respective receptacle of the pair of receptacles to detachably connect each latch to the chassis, wherein each latch comprises a housing having a pivot pin and a pair of pillars located on a base portion of the housing, a pair of first through slots located on a cover portion of the housing, a cantilever beam having a pair of prongs, and an elastic member, and wherein each receptacle of the pair of receptacles comprises a pair of second through slots aligned with the pair of first through slots; and
a pair of first bars spaced apart from each other by a second bar extending therebetween,
wherein each of the pair of first bars has a first end pivotably connected to a respective latch, and a second end connected to the second bar for defining an open space between the pair of first bars and the second bar, wherein the second bar supports the plurality of cables, and wherein the pair of first bars is pivotable relative to the pair of latches such that the second bar is movable to a plurality of preset positions.

11. The computing system of claim 10, wherein the pivot pin protrudes into a through-hole of a respective first bar to pivotably connect the respective first bar to the respective latch.

12. The computing system of claim 10, wherein the cantilever beam is disposed within the housing and coupled to the housing such that the pair of prongs protrudes outside the housing via the pair of first through slots, and a free end portion of the cantilever beam protrudes outside the cover portion of the housing, and wherein, upon slidably inserting each latch into the respective receptacle, the pair of prongs further protrudes outside the respective receptacle via the pair of second through slots so as to detachably connect each latch to the chassis.

13. The computing system of claim 10, wherein the elastic member comprises a protruded section facing a respective first bar, and wherein the elastic member is disposed below the cantilever beam, and each end portion of the elastic member is mounted on a respective pillar of the pair of pillars.

14. The computing system of claim 13, wherein the first end of each of the pair of first bars comprises a gear feature having spaced apart teeth, where a space is formed between each mutually adjacent teeth.

15. The computing system of claim 14, wherein the space of the gear feature is engaged to the protruded section of the elastic member for defining one preset position of the plurality of preset positions to the second bar.

16. The computing system of claim 14, wherein the protruded section of the elastic member, deforms upon rotation of the gear feature caused by a pivotal motion of each first bar, and engages to adjacent space of the gear feature for shifting the second bar from a first preset position to a second preset position of the plurality of preset positions.

17. The computing system of claim 10, wherein the plurality of preset positions comprises a first preset position, wherein the vertically oriented electronic component is disposed between the pair of receptacles, and wherein, in the first preset position, the second bar provides a clearance from the plurality of cables to access the vertically oriented electronic component from the at least one of the pair of vertical compartments via the open space.

18. The computing system of claim 17, wherein the plurality of preset positions comprises a second preset position, wherein the horizontally oriented electronic component is disposed adjacent the pair of receptacles, and wherein, in the second preset position, the second bar provides the clearance from the plurality of cables to access the horizontally oriented electronic component from the at least one of the plurality of horizontal compartments via the open space.

\* \* \* \* \*